US012811556B2

(12) United States Patent
Meister et al.

(10) Patent No.: US 12,811,556 B2
(45) Date of Patent: Nov. 24, 2026

(54) ACOUSTIC DEVICES INCLUDING ACOUSTIC MIRRORS CO-OPTIMIZED FOR LONGITUDINAL AND SHEAR WAVE REFLECTION, AND RELATED METHOD OF FABRICATION

(71) Applicant: RF360 Singapore Pte. Ltd., Singapore (SG)

(72) Inventors: Veit Meister, Unterhaching (DE); Maximilian Schiek, Puchheim (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 875 days.

(21) Appl. No.: 18/297,847

(22) Filed: Apr. 10, 2023

(65) Prior Publication Data

US 2024/0339981 A1 Oct. 10, 2024

(51) Int. Cl.
*H03H 3/02* (2006.01)
*H03H 9/17* (2006.01)

(52) U.S. Cl.
CPC .............. *H03H 3/02* (2013.01); *H03H 9/175* (2013.01); *H03H 2003/025* (2013.01)

(58) Field of Classification Search
CPC ..... H03H 3/02; H03H 9/175; H03H 2003/025
See application file for complete search history.

(56) References Cited

U.S. PATENT DOCUMENTS 5,873,154 A * 2/1999 Ylilammi ................. H03H 3/02 29/25.35
6,407,649 B1 * 6/2002 Tikka ..................... H03H 9/706 29/25.35
(Continued)

FOREIGN PATENT DOCUMENTS

CN 112910433 A * 6/2021 ............... H03H 9/17
CN 116208114 A * 6/2023 ......... H03H 9/02015
(Continued)

OTHER PUBLICATIONS

Marksteiner S., et al., "Optimization of Acoustic Mirrors for Solidly Mounted BAW Resonators", 2005 IEEE Ultrasonics Symposium, pp. 329-332.
(Continued)

*Primary Examiner* — Pedro J Cuevas
(74) *Attorney, Agent, or Firm* — W&T

(57) ABSTRACT

An acoustic device includes a piezoelectric layer between a first, bottom electrode and a second, top electrode, and an acoustic mirror optimized for reflecting longitudinal waves and shear waves at a target operating frequency. The acoustic mirror includes lower acoustic impedance layers and at least one higher acoustic impedance layer. In an example, layers of the acoustic mirror alternate between lower impedance and higher impedance, with a first lower acoustic impedance layer adjacent to the bottom electrode, and a first higher acoustic impedance layer having a greater thickness than a second higher acoustic impedance layer. In another example, the acoustic mirror has a higher acoustic impedance layer with a thickness corresponding to at least half of a wavelength of the target operating frequency in the higher acoustic impedance layer. An acoustic device with an acoustic mirror optimized for both longitudinal waves and shear waves reduces energy losses for increased efficiency.

22 Claims, 6 Drawing Sheets

(56) References Cited

U.S. PATENT DOCUMENTS 6,603,241 B1 * 8/2003 Barber ................... H03H 9/175 310/335
6,720,844 B1 * 4/2004 Lakin ..................... H03H 9/589 333/191
6,841,922 B2 1/2005 Aigner et al.
6,917,261 B2 * 7/2005 Unterberger ........... H03H 9/589 310/322
6,998,940 B2 * 2/2006 Metzger ................. H03H 9/584 29/25.35
7,057,478 B2 * 6/2006 Korden .................. H03H 9/605 333/191
7,138,889 B2 * 11/2006 Lakin ..................... H03H 9/586 333/189
7,230,509 B2 * 6/2007 Stoemmer .............. H03H 9/585 310/322
7,424,772 B2 * 9/2008 Larson, III ............. H03H 9/587 29/25.35
7,425,787 B2 * 9/2008 Larson, III ............. H04B 11/00 310/326
7,436,269 B2 * 10/2008 Wang ..................... H03H 9/584 333/133
7,439,824 B2 * 10/2008 Aigner ............... H03H 9/02118 333/187
7,612,636 B2 * 11/2009 Jamneala ............. H03H 9/0095 333/191
7,675,390 B2 * 3/2010 Larson, III ............. H03H 9/587 310/326
7,684,109 B2 * 3/2010 Godshalk ............... H03H 9/175 359/305
7,719,390 B2 * 5/2010 Iwasaki .................... H03H 3/04 29/25.35
7,737,807 B2 * 6/2010 Larson, III ............. H03H 9/584 310/326
7,760,049 B2 * 7/2010 Uno ....................... H03H 9/175 333/186
7,791,435 B2 * 9/2010 Jamneala ............... H03H 9/589 333/133
7,795,998 B2 * 9/2010 Mayer .................... H03H 9/175 333/187
7,855,618 B2 * 12/2010 Frank ..................... H03H 9/132 333/187
7,893,793 B2 * 2/2011 Iwasaki .................. H03H 9/564 333/133
8,390,397 B2 * 3/2013 Jamneala ............... H03H 9/589 310/322
8,508,315 B2 * 8/2013 Jamneala ............... H03H 9/584 333/133
8,587,391 B2 * 11/2013 Gilbert ................... H03H 9/587 310/322
8,593,234 B2 * 11/2013 Bar .......................... H03H 3/02 333/187
9,099,983 B2 * 8/2015 Burak .................. H03H 9/0211
9,219,466 B2 12/2015 Meltaus et al.
9,490,418 B2 * 11/2016 Burak .................... H10N 30/88
9,525,397 B2 * 12/2016 Burak .................... H03H 9/171
9,647,625 B2 * 5/2017 Petit ................... H03H 9/02102
9,929,714 B2 3/2018 Jacobsen et al.
10,075,143 B2 * 9/2018 Pelzel .................. H03H 1/0007
10,164,601 B2 * 12/2018 Marksteiner ....... H03H 9/02102
10,566,944 B2 * 2/2020 Pelzel .................. H03H 1/0007
10,797,680 B2 * 10/2020 Mimura ................. H03H 9/175
11,552,614 B2 * 1/2023 Caron .................. H03H 9/0514
12,009,797 B2 * 6/2024 Goto ...................... H03H 9/175
12,063,026 B2 * 8/2024 Caron .................... H03H 9/564
12,294,349 B2 * 5/2025 Ella .................... H03H 9/02086
12,470,198 B2 * 11/2025 Caron .................... H03H 9/132
12,525,948 B2 * 1/2026 Goto .................. H03H 9/02559
12,531,541 B2 * 1/2026 Fukuhara ........... H03H 9/02228
12,567,854 B2 * 3/2026 Fukuhara ........... H03H 9/02228
12,587,160 B2 * 3/2026 Goto .................. H03H 9/02015
12,597,909 B2 * 4/2026 Esquius Morote .......................... H03H 9/02086
2004/0145430 A1 * 7/2004 Metzger ................... H03H 3/02 333/191
2004/0150293 A1 * 8/2004 Unterberger ........... H03H 9/589 310/322
2005/0012570 A1 * 1/2005 Korden .................. H03H 9/583 333/191
2005/0200433 A1 * 9/2005 Aigner ............... H03H 9/02118 333/191
2006/0214747 A1 * 9/2006 Lakin ..................... H03H 9/586 333/191
2007/0176710 A1 * 8/2007 Jamneala ............... H03H 9/584 333/191
2008/0051039 A1 * 2/2008 Iwasaki .................. H03H 9/173 455/73
2008/0180193 A1 * 7/2008 Iwasaki .................... H03H 3/04 29/25.35
2008/0204857 A1 * 8/2008 Godshalk ............... H03H 9/175 359/305
2009/0002098 A1 * 1/2009 Mayer .................... H03H 9/175 333/189
2011/0204995 A1 * 8/2011 Jamneala ............... H03H 9/584 29/25.35
2014/0232486 A1 * 8/2014 Burak ................ H03H 9/02118 333/187
2016/0365842 A1 * 12/2016 Marksteiner ............. H03H 9/54
2017/0141750 A1 * 5/2017 Pelzel .................. H03H 1/0007
2019/0028081 A1 * 1/2019 Pelzel .................. H03H 1/0007
2019/0165763 A1 * 5/2019 Mimura ............ H03H 9/02834
2019/0305752 A1 * 10/2019 Sadhu ................ H03H 9/02157
2020/0021272 A1 * 1/2020 Segovia Fernandez ..................... H03B 5/326
2021/0167752 A1 * 6/2021 Caron .................... H03H 9/564
2022/0321088 A1 * 10/2022 Goto .................. H03H 9/02559
2022/0321096 A1 * 10/2022 Goto .................. H03H 9/02559
2023/0103956 A1 * 4/2023 Fukuhara ........... H03H 9/02015 29/25.35
2023/0104500 A1 * 4/2023 Fukuhara ............. H03H 9/0547 333/187
2023/0105034 A1 * 4/2023 Fukuhara ................. H04B 1/40 29/25.35
2023/0107728 A1 * 4/2023 Fukuhara ................. H04B 1/40 455/73
2023/0107820 A1 * 4/2023 Fukuhara ........... H03H 9/02228 310/365
2023/0163746 A1 * 5/2023 Caron ................ H03H 9/02228 333/187
2023/0216476 A1 * 7/2023 Burak ...................... H03H 9/13 331/154
2023/0216479 A1 * 7/2023 Gong ..................... H03H 9/175 310/348
2024/0097642 A1 * 3/2024 Ella ........................ H03H 9/568
2024/0120901 A1 * 4/2024 Gong ................. H03H 9/02015
2024/0356515 A1 * 10/2024 Goto .................. H03H 9/02015
2024/0356516 A1 * 10/2024 Caron ...................... H03H 9/58
2025/0023547 A1 * 1/2025 Wang ....................... H03H 3/02
2025/0219614 A1 * 7/2025 Esquius Morote .......................... H03H 9/02086
2025/0247074 A1 * 7/2025 Wang ..................... H03H 9/173
2025/0253824 A1 * 8/2025 Ella .......................... H03H 3/04
2026/0031783 A1 * 1/2026 Aoki .................. H03H 9/02031

FOREIGN PATENT DOCUMENTS

DE 10160617 A1 * 6/2003 ............. H03H 9/585
DE 102016124236 A1 * 6/2018 ......... H03H 9/02125
EP 4693900 A1 * 2/2026 ............. H10N 30/87
IT 202100007364 A1 9/2022
JP 2025115838 A * 8/2025 ............... H03H 9/17
KR 20190095876 A * 8/2019 ......... H03H 9/02614
KR 102169189 B1 * 10/2020 ............. H03H 9/175
WO WO-2013068652 A1 * 5/2013 ............... H03H 3/04
WO 2022243908 A2 11/2022

(56) References Cited

FOREIGN PATENT DOCUMENTS

| | | | | |
|---|---|---|---|---|
| WO | WO-2023033032 A1 * | 3/2023 | ............. | H03H 9/725 |
| WO | WO-2024157984 A1 * | 8/2024 | ............... | H03H 3/02 |

OTHER PUBLICATIONS

Jose, S., "Reflector stack optimization for Bulk Acoustic Wave resonators," PhD thesis—University of Twente, Enschede, The Netherlands, 2011, 147 pages.

International Search Report and Written Opinion for International Patent Application No. PCT/SG2024/050110, mailed Jul. 1, 2024, 13 pages.

* cited by examiner

ACOUSTIC DEVICES INCLUDING ACOUSTIC MIRRORS CO-OPTIMIZED FOR LONGITUDINAL AND SHEAR WAVE REFLECTION, AND RELATED METHOD OF FABRICATION

BACKGROUND

I. Field of the Disclosure

The technology of the disclosure relates generally to micro-acoustic devices, and more particularly to acoustic wave resonators for high-frequency filters.

II. Background

Wireless devices, such as cellular telephones, communicate by transmitting and receiving electromagnetic waves through the air. Cellular telephones, for example, are wireless devices allowed to operate only in limited ranges of radio frequencies, and those ranges vary depending on the geographical region (e.g., country) of the world. Thus, cellular telephones worldwide have filters for limiting the frequency signals that are transmitted and received. The frequencies of wireless signals are limited by transmitted by radio-frequency filters implemented by acoustic wave resonators, which are micro-acoustic devices small enough to fit into a handheld device. Acoustic resonators include surface acoustic wave (SAW) resonators, bulk acoustic wave (BAW) resonators, and Lamé mode resonators. Acoustic resonators include electrodes on a piezoelectric material to convert electromagnetic waves into acoustic waves, filter the acoustic waves, and convert the filtered waves back into electromagnetic waves. Some energy is lost in the acoustic waves within the piezoelectric material and additional energy loss results from acoustic waves escaping the piezoelectric device. Battery-powered handheld wireless devices that employ acoustic devices have strict energy efficiency requirements. Therefore, manufacturers of such acoustic devices continuously strive to improve energy efficiency. In this regard, there is a desire to minimize acoustic losses in acoustic wave devices used in radio-frequency filters.

SUMMARY

Aspects disclosed in the detailed description include acoustic wave devices, including acoustic mirrors co-optimized for longitudinal and shear wave reflection. Related methods of fabricating an acoustic device having co-optimized acoustic mirrors are also disclosed. Acoustic waves propagating through piezoelectric material in an acoustic device include longitudinal waves and shear waves. Acoustic mirrors employed to reflect acoustic waves may be designed to primarily reflect the longitudinal waves but not the shear waves, which are at a different frequency than the longitudinal waves, resulting in significant energy loss. In this regard, an exemplary acoustic device is provided that includes a piezoelectric layer between a first, bottom electrode and a second, top electrode, and an acoustic mirror including at least one higher impedance layer co-optimized for reflecting longitudinal waves and shear waves corresponding to a target operating frequency. The acoustic mirror includes lower acoustic impedance layers (lower impedance layers) and at least one higher acoustic impedance layer (higher impedance layer). In an example, layers of the acoustic mirror alternate between lower impedance and higher impedance, with a second higher impedance layer having a greater thickness than a first higher impedance layer. In another example, the acoustic mirror has a single higher impedance layer with a thickness corresponding to at least half of a wavelength of a target operating frequency in the higher impedance layer. An acoustic device with an acoustic mirror co-optimized for both longitudinal waves and shear waves reduces energy losses for increased efficiency.

In a first exemplary aspect, an acoustic device is disclosed. The acoustic device includes a first electrode, a piezoelectric layer disposed on a first side of the first electrode, and a second electrode disposed on the piezoelectric layer. The acoustic device also includes an acoustic mirror disposed on a second side of the first electrode opposite to the piezoelectric layer. The acoustic mirror comprises a first higher impedance layer having a first thickness and a second higher impedance layer having a second thickness, wherein the second thickness is greater than the first thickness. The acoustic mirror further comprises a first lower impedance layer between the first higher impedance layer and the second higher impedance layer, and a second lower impedance layer between the second higher impedance layer and the first electrode.

In another exemplary aspect, a method of fabricating an acoustic device is disclosed, the method comprising forming an acoustic mirror. Forming the acoustic mirror comprises forming a first higher impedance layer comprising a first thickness and forming a first lower impedance layer on the first higher impedance layer. Forming the acoustic mirror further comprises forming a second higher impedance layer comprising a second thickness on the first lower impedance layer, wherein the second thickness is greater than the first thickness; and forming a second lower impedance layer on the second higher impedance layer. Forming the acoustic device further comprises forming a first electrode on the acoustic mirror, forming a piezoelectric layer on the first electrode, and forming a second electrode on the piezoelectric layer.

In a further exemplary aspect, an acoustic device is disclosed. The acoustic device comprises a first electrode, a piezoelectric layer disposed on a first side of the first electrode, a second electrode disposed on the piezoelectric layer, and an acoustic mirror. The acoustic mirror is disposed on a second side of the first electrode opposite to the piezoelectric layer. The acoustic mirror comprises a first higher impedance layer comprising a higher impedance material having a first thickness corresponding to greater than half of a wavelength at a target frequency in the higher impedance material. The acoustic mirror also comprises a first lower impedance layer comprising a lower impedance material having a second thickness corresponding to less than half of a wavelength of the target frequency in the lower impedance material, the first lower impedance layer disposed between the first higher impedance layer and the first electrode.

DETAILED DESCRIPTION

Figure 1:
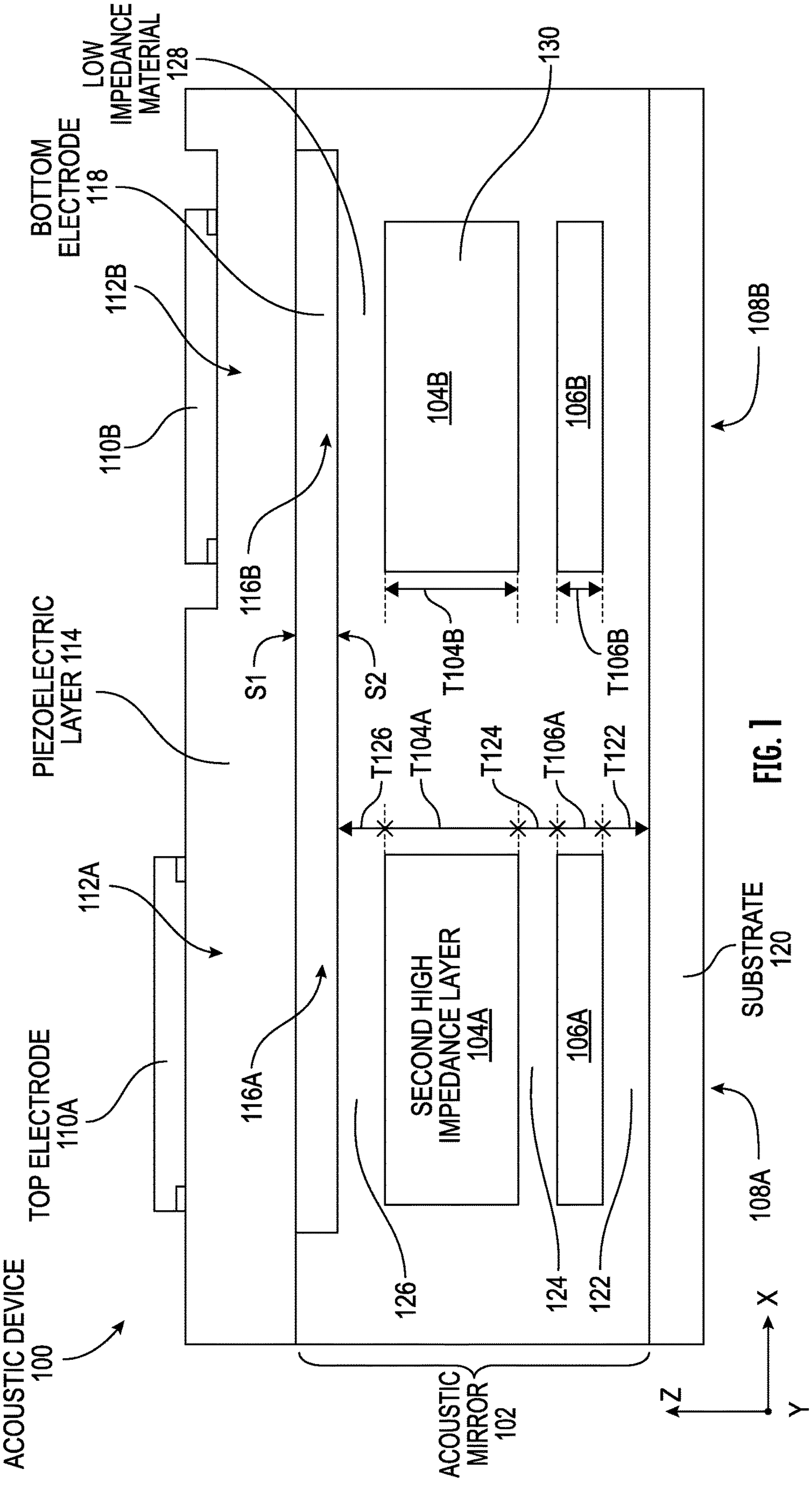
FIG. 1 is a cross-sectional side view of an exemplary acoustic device in which an acoustic mirror includes higher impedance layers having different thicknesses to optimize reflections of longitudinal waves and shear waves at a target frequency.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include acoustic wave devices, including acoustic mirrors co-optimized for longitudinal and shear wave reflection. Related methods of fabricating an acoustic mirror are also disclosed. Acoustic waves propagating through piezoelectric material in an acoustic device include longitudinal waves and shear waves. Acoustic mirrors employed to reflect acoustic waves may be designed to primarily reflect the longitudinal waves but not the shear waves, which are at a different frequency than the longitudinal waves, resulting in significant energy loss. In this regard, an exemplary acoustic device 100, as shown in FIG. 1, is provided that includes a piezoelectric layer 114 between a first, bottom electrode 118 and a second, top electrode 110A, and an acoustic mirror 102 including at least one higher impedance layer 104A co-optimized for reflecting longitudinal waves and shear waves corresponding to a target operating frequency. The acoustic mirror 102 includes lower acoustic impedance layers (lower impedance layers) 122, 124, 126 and at least one higher impedance layer (higher impedance layer) 104A. In an example, layers of the acoustic mirror 102 alternate between lower impedance and higher impedance, with a second higher impedance layer 104A having a greater thickness than a first higher impedance layer 106A. In another example, the acoustic mirror 102 has a single higher impedance layer with a thickness corresponding to at least half of a wavelength of a target frequency in the higher impedance layer. An acoustic device 100 with an acoustic mirror 102 co-optimized for both longitudinal waves and shear waves reduces energy losses for increased efficiency.

FIG. 1 is a cross-sectional side view of an acoustic device 100 in which an acoustic mirror 102 includes first and second higher impedance layers 106A and 104A, respectively, in a first resonator 108A and third and fourth higher impedance layers 106B and 104B, respectively, in a second resonator 108B. The second and fourth higher impedance layers 104A and 104B have thicknesses co-optimized for reflecting both longitudinal waves and shear waves at a target frequency. In other words, thicknesses of the second higher impedance layer 104A and the fourth higher impedance layer 104B are related to wavelengths of the longitudinal waves and the shear waves of respective target resonant frequencies of the first resonator 108A and a second resonator 108B which may have different resonant frequencies.

The acoustic device 100 also includes a second, top electrode 110A and a third, top electrode 110B for receiving respective signals that create acoustic waves in different regions 112A and 112B of a piezoelectric layer 114. The regions 112A and 112B of the piezoelectric layer 114 correspond to the resonators 108A, 108B. The resonators 108A, 108B also employ corresponding regions 116A, 116B of a first, bottom electrode 118, which provides a common reference voltage for the resonators 108A, 108B. The top electrodes 110A, 110B, the piezoelectric layer 114, and the bottom electrode 118 extend in planes in the X-axis and Y-axis directions. The top electrodes 110A and 110B and the bottom electrode 118 may include but are not limited to any one or more of molybdenum (Mo), platinum (Pt), ruthenium (Ru), osmium (Os), iridium (Ir), aluminum (Al), and copper (Cu), and alloys and/or combinations thereof.

Signals applied to the first top electrode 110A and the second top electrode 110B primarily produce longitudinal waves in the piezoelectric layer 114 (e.g., waves in a direction orthogonal to the piezoelectric layer 114 or Z-axis direction). However, shear waves (e.g., traveling in the X-axis and/or Y-axis directions) can also be generated directly or by conversion of the longitudinal waves at the edges and surfaces layers through which the longitudinal waves propagate. The piezoelectric layer 114 may include, but is not limited to, any one of aluminum nitride (AlN), aluminum scandium nitride (AlScN), aluminum yttrium nitride (AlYN), zinc oxide (ZnO), lithium tantalate (LiTaO3), and lithium niobate (LiNbO3).

The piezoelectric layer 114 is disposed on a first side S1 (e.g., upper side in the Z-axis direction) of the bottom electrode 118 and the acoustic mirror 102 is disposed on a second side S2 (e.g., lower side in the Z-axis direction) of the bottom electrode 118 opposite to the piezoelectric layer 114. The acoustic mirror 102 is provided to reflect the energy of waves produced in the piezoelectric layer 114 to reduce or prevent energy loss from the acoustic device 100 through a substrate 120.

Layers in the acoustic mirror 102 alternate between one of the lower impedance layers 122, 124, and 126 and one of the higher impedance layers 106A and 104A in the first resonator 108A and one of the higher impedance layers 106B and 104B in the second resonator 108B. The acoustic mirror 102 includes the bottom lower impedance layer 122 adjacent to the substrate 120. Proceeding in order from the substrate 120 toward the bottom electrode 118 in the resonator 108A, the acoustic mirror 102 next includes the first higher impedance layer 106A. A first lower impedance layer 124 is between the first higher impedance layer 106A and the second higher impedance layer 104A, and a second lower impedance layer 126 is between the second higher impedance layer 104A and the bottom electrode 118. The lower impedance layers 122, 124, and 126 are layers of a lower acoustic impedance material 128 (lower impedance material) including but not limited to one or more of silicon dioxide ($SiO_2$), silicon oxycarbide (SiOC), silicon oxycarbonitride (SiOCN), and silicon oxyfluoride (SiOF). The higher impedance layers 104A and 106A are layers of a higher acoustic impedance material 130 (higher impedance material), including but not limited to one or more of Tungsten (W), Mo, Os, Ir, and Pt, which have a higher or greater acoustic impedance than the lower acoustic impedance material 128. The materials identified here are merely non-limiting examples.

A conventional acoustic mirror design may include two mirror pairs, each mirror pair including a lower impedance layer and a higher impedance layer, where a thickness of each layer corresponds to one-quarter (¼) of a wavelength (lambda) (λ).

In the acoustic device 100, the acoustic mirror 102 is co-optimized to reflect longitudinal acoustic waves and shear acoustic waves by optimizing a first thickness T106A of the first higher impedance layer 106A, a second thickness T104A of the second higher impedance layer 104A, and third and fourth thicknesses T124 and T126 of the lower impedance layers 124 and 126, respectively, according to the wavelengths of the acoustic waves propagating through the acoustic mirror 102. Longitudinal waves are generated in the piezoelectric layer 114 at or about a target frequency, which is a frequency at which the acoustic device 100 is intended to operate. In some examples, the acoustic device 100 has a target frequency $F_{100}$ (e.g., 11-15 GHZ). The longitudinal waves have a longitudinal wavelength $\lambda_{LL}$ that depends on the acoustic impedance of a material through which the acoustic wave is propagating. The acoustic impedance determines a velocity of the acoustic wave. Thus, the longitudinal wavelength $\lambda_{LL}$ depends on both frequency and material properties. Shear waves, which may be generated by conversion, for example, have a frequency of about half the frequency of the longitudinal waves and, therefore, a shear wavelength $\lambda_{SL}$ that may be approximately twice the length (i.e., half the frequency) of the longitudinal waves.

Co-optimizing the acoustic mirror 102, in some examples, includes making the thicknesses T126 and T124 less than half (<½) of the longitudinal wavelength $\lambda_{LL}$. Alternatively, in some examples, the thicknesses T126 and T124 are each made less than half (<½) of the shear wavelength $\lambda_{SL}$. The thicknesses T126 and T124 may be different from each other or the same as each other. In some examples, the lower impedance layers 126 and 124 are each one-quarter (¼) or about ¼ of the longitudinal wavelength $\lambda_{LL}$ in the lower acoustic impedance material 128 at the target frequency $F_{100}$. In other words, in some examples, the lower impedance layers have thicknesses T126 and T124 of $\lambda_L/4$.

The first higher impedance layer 106A in the acoustic mirror 102 has the first thickness T106A which may be less than half of a longitudinal wavelength $\lambda_{LH}$ ($<\lambda_{LH}/2$) in the higher acoustic impedance material 130 at the target frequency $F_{100}$. In some examples, the first thickness T106A may be less than half of a shear wavelength $\lambda_{SH}$ ($<\lambda_{SH}/2$) in the higher acoustic impedance material 130 at the target frequency $F_{100}$. In some examples, the thickness T106A of the first higher impedance layer 106A is one quarter (¼) of the longitudinal wavelength $\lambda_{LH}$ ($\lambda_{LH}/4$) in the higher acoustic impedance material 130 at the target frequency $F_{100}$ or may be within a range of twenty percent (20%) (e.g., more than or less than) of one-quarter of the wavelength $\lambda_{LH}$ in the higher acoustic impedance material 130 at the target frequency $F_{100}$. In some examples, the thickness T106A of the first higher impedance layer 106A is one quarter (¼) of the shear wavelength $\lambda_{SH}(\lambda_{SH}/4)$ in the higher acoustic impedance material 130 at the target frequency $F_{100}$. In some examples, the thickness T106A of the first higher impedance layer 106A is one quarter (¼) of the longitudinal wavelength $\lambda_{SH}$ in the higher acoustic impedance material 130 at the target frequency $F_{100}$ or may be within a range of twenty percent (20%) (e.g., more than or less than) of one-quarter of the shear wavelength $\lambda_{SH}$ in the higher acoustic impedance material 130 at the target frequency $F_{100}$.

In contrast to conventional acoustic mirrors mentioned above, the second higher impedance layer 104A has a second thickness T104A that is greater than the first thickness T106A of the first higher impedance layer 106A. In particular, the second thickness T104A may be greater than half the longitudinal wavelength $\lambda_{LH}$(>λLH/2) while the thickness T106A of the first higher impedance layer 106A is less than half the wavelength $\lambda_{LH}(<\lambda_{LH}/2)$. In some examples, the second thickness T104A is at least two times (2×) the first thickness T106A. In some examples, the second thickness T104A is at least three times (3×) the first thickness T106A. In some examples, the second thickness T104A of the second higher impedance layer 104A is three-quarters (¾) of the wavelength $\lambda_{LH}(3\lambda_{LH}/4)$ in the higher acoustic impedance material 130 at the target frequency $F_{100}$. In some examples, the second thickness T104A of the second higher impedance layer 104A is within 20% (less or more) of three-quarters (¾) of the wavelength $\lambda_{LH}(3\lambda_{LH}/4)$. In other words, the second thickness T104A may be in the range from $(0.8)\times(3\lambda_{LH}/4)$ and $(1.2)\times(3\lambda_{LH}/4)$. Including a second higher impedance layer 104A having the thickness T104A in the ranges disclosed above provides a co-optimization of reflection properties of the longitudinal and shear waves generated in the region 112A of the piezoelectric layer 114.

Alternatively, the second thickness T104A may be greater than half the shear wavelength $\lambda_{SH}$(>λLH/2), while the thickness T106A of the first higher impedance layer 106A is less than half the shear wavelength $\lambda_{SH}(<\lambda_{SH}/2)$. In some examples, the second thickness T104A of the second higher impedance layer 104A is three-quarters (¾) of the wavelength $\lambda_{SH}(3\lambda_{SH}/4)$ in the higher acoustic impedance material 130 at the target frequency $F_{100}$. In some examples, the second thickness T104A of the second higher impedance layer 104A is within 20% (less or more) of three-quarters (¾) of the shear wavelength $\lambda_{SH}(3\lambda_{SH}/4)$. In other words, the second thickness T104A may be in the range from $(0.8)\times(3\lambda_{SH}/4)$ and $(1.2)\times(3\lambda_{SH}/4)$.

Including a second higher impedance layer 104A having the thickness T104A in the ranges disclosed above provides a co-optimization of reflection properties of the longitudinal and shear waves generated in the region 112A of the piezoelectric layer 114. In the resonator 108B, the acoustic mirror 102 includes a stack 134 of lower impedance and higher impedance layers corresponding to the layers of the acoustic mirror 102 in the resonator 108A. In particular, the thicknesses of layers in the stack 134 in the resonator 108B may be the same as the thicknesses of the layers discussed above in the acoustic mirror 102 of the resonator 108A.

In the resonator 108A, the first top electrode 110A is disposed on the piezoelectric layer 114 opposite to the region 116A region of the bottom electrode 118 and the second top electrode 110B is disposed on the piezoelectric layer 114 opposite to the region 116B of the bottom electrode 118. In the acoustic mirror 102 opposite to the region 116B of the bottom electrode 118, the acoustic device 100 includes the third higher impedance layer 106B and the fourth higher impedance layer 104B. The fourth higher impedance layer 104B is disposed between the first lower impedance layer 124 and the second lower impedance layer 126. The third higher impedance layer 106B has a fifth thickness T106B that may be in the range of thickness T106A of the first higher impedance layer 106A but may not be the same as thickness T106A. The fourth higher impedance layer 104B has a sixth thickness T104B that may be in the range of thickness T104A of the second higher impedance layer 104A but may not be the same as thickness T104A. In any case, the sixth thickness T104B of the fourth higher impedance layer 104B is greater than the fifth thickness T106B of the third higher impedance layer 106B.

The acoustic device 100 may comprise any of a bulk acoustic wave (BAW) resonator, and a solidly mounted resonator (SMR). The acoustic mirror 102 may comprise a Bragg mirror and, in an alternative to the BAW resonator shown in FIG. 1, may be employed in acoustic devices including Lamé mode resonators and surface acoustic wave (SAW) devices (not shown).

Figure 2:
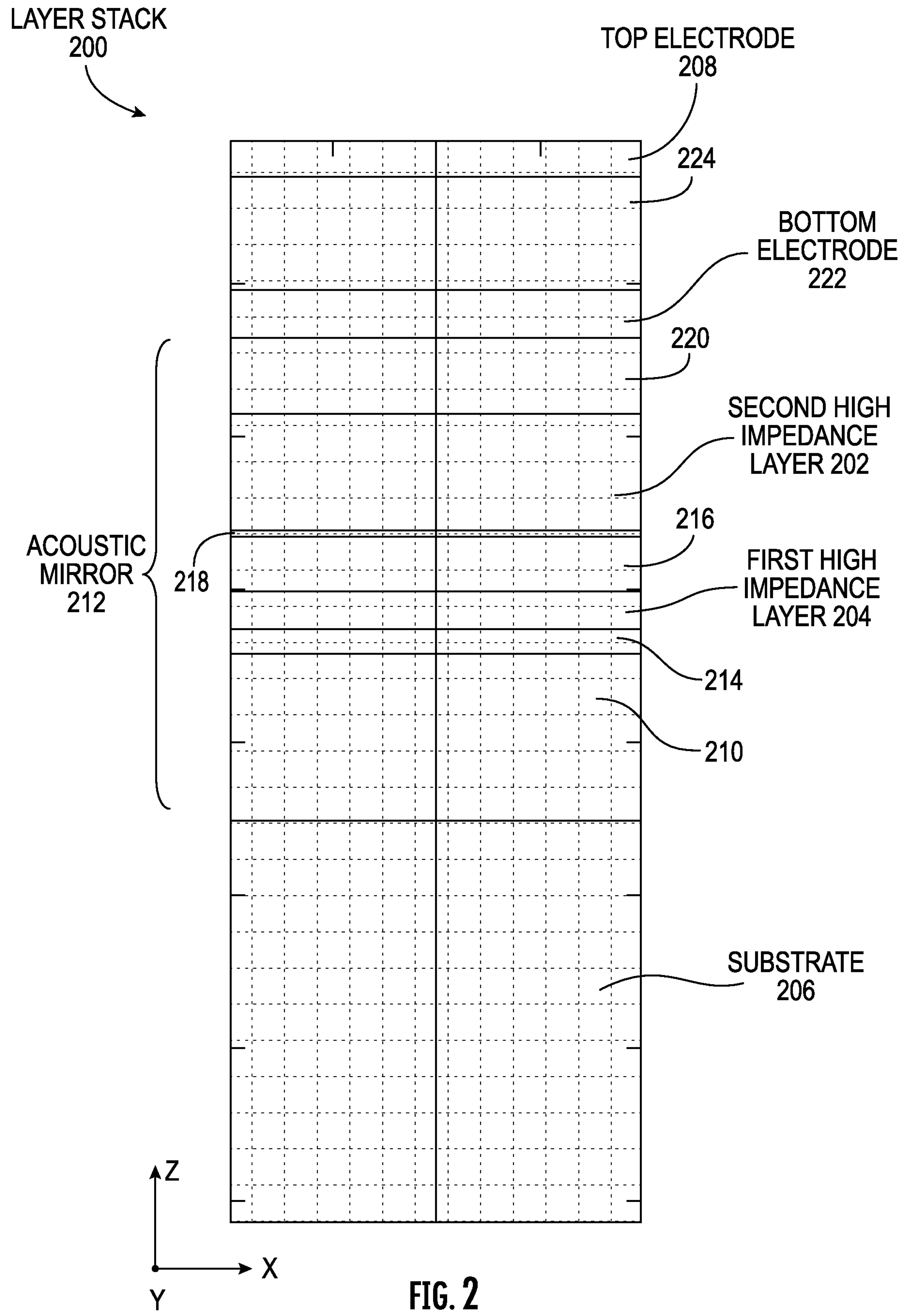
FIG. 2 is a detailed cross-sectional view of an exemplary layer stack that may be in the acoustic device in FIG. 1, wherein the layer stack includes a second higher impedance layer that is thicker than a first higher impedance layer to co-optimize for reflecting longitudinal and shear waves.

FIG. 2 is a detailed cross-sectional view of a layer stack 200, which may be in the acoustic device 100 in FIG. 1, including a second higher impedance layer 202 thicker than a first high-impedance layer 204 to co-optimize for reflection of longitudinal and shear waves. Layers of the layer stack 200 are formed sequentially, in order in the Z-axis direction from a substrate 206 (e.g., silicon (Si) corresponding to the substrate 120 in FIG. 1) to a second, top electrode 208 using existing fabrication processes. The layer stack 200 includes a bottom lower impedance layer 210 of an acoustic mirror 212. The bottom lower impedance layer 210 may be a layer of amorphous $SiO_2$ or other lower acoustic impedance material as described above.

A seed layer 214 is formed on the bottom lower impedance layer 210 to provide a lattice structure for growing the first higher impedance layer 204 (e.g., W). The first higher impedance layer 204 may be formed, in an example, by sputtering W onto the seed layer 214. The seed layer 214 may also be referred to as an adhesion layer because it also improves adhesion of the first higher impedance layer 204 to the bottom lower impedance layer 210. The seed layer 214 may be titanium (Ti) or aluminum nitride (AlN), for example. A first lower impedance layer 216 may be formed directly on the first higher impedance layer 204 in cases in which the lower impedance layer has good adhesion to the first higher impedance layer. As an example, $SiO_2$ has good adhesion when formed on W. Before forming the second higher impedance layer 202 on the first lower impedance layer 216, another seed layer (e.g., adhesion layer of Ti or AlN) 218 is formed on the first lower impedance layer 216. A second low-impedance layer 220 is formed on the second high-impedance layer 202. Next, in order, a first, bottom electrode 222 of metal (e.g., molybdenum (Mo), a piezoelectric layer 224 (e.g., aluminum nitride (AlN) or aluminum scandium nitride (AlScN)), and the top electrode 208 are formed sequentially in the Z-axis direction. The second, top electrode 208 is also a metal electrode that may be a same or different material that the first, bottom electrode 222.

Although not shown in FIG. 2, the layer stack 200 may include additional layers. For example, in examples in which the top electrode 208 is a different material than the bottom electrode 222, a buffer layer may be needed between the top electrode 208 and the piezoelectric layer 224. In addition, a buffer layer is included on the bottom electrode 222 before the piezoelectric material 224 is formed (e.g., to improve a lattice match). In addition, the layer stack 200 may also include a passivation layer that is protective of the top electrode 208 and may also be used for frequency trimming of the acoustic device 100. However, it should be understood that the buffer layers, the passivation layer, and the seed layers (214 and 218) are significantly thinner than the acoustically active layers and therefore do not significantly affect the resonant frequencies of the layer stack 200 in the acoustic device 100.

Figure 3:
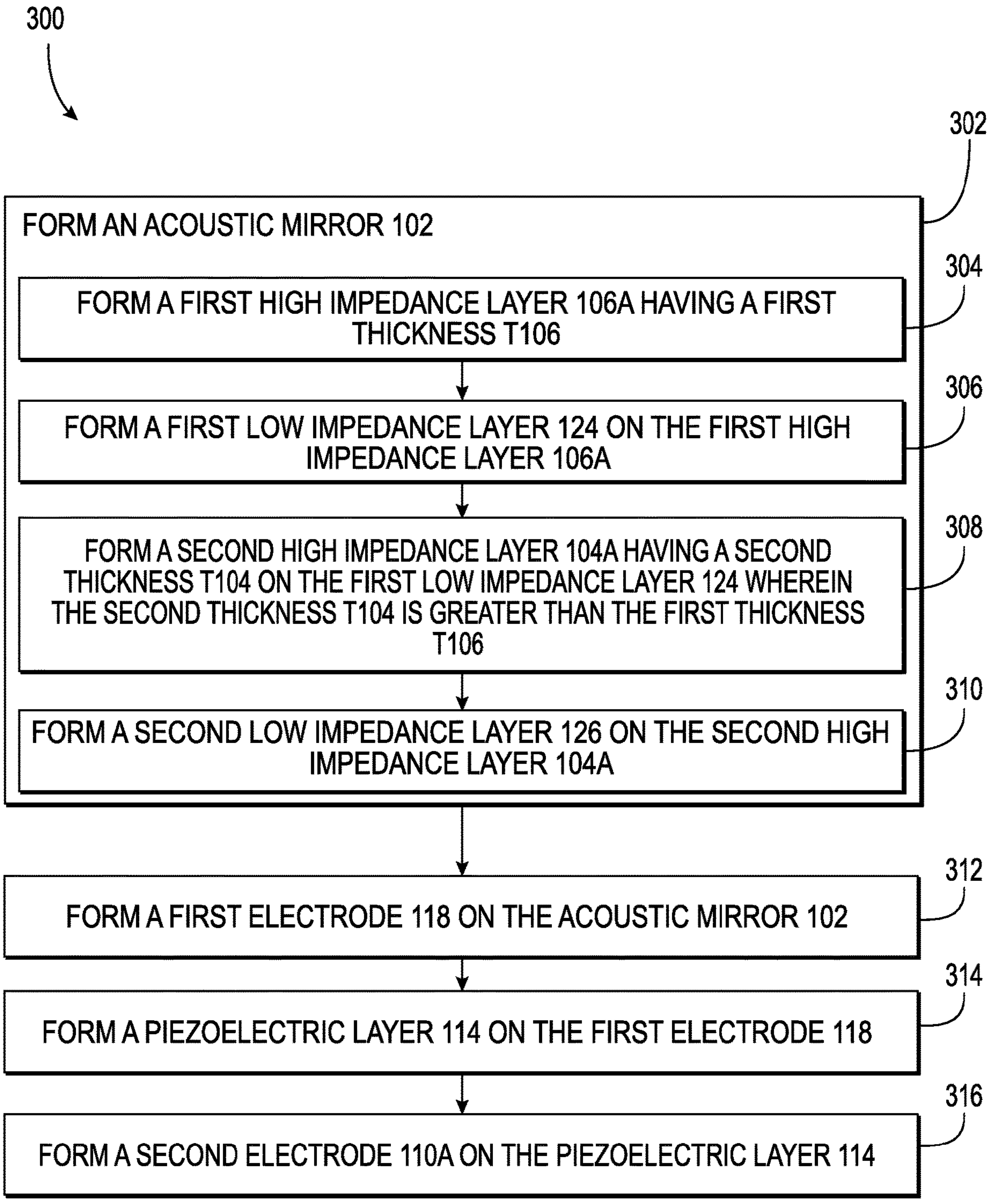
FIG. 3 is a flowchart illustrating a method of fabricating an acoustic device including higher impedance layers of different thickness to co-optimize for reflecting longitudinal and shear waves, including but not limited to the acoustic device in FIGS. 1 and 2.

Fabrication processes can be employed to fabricate an acoustic device including an acoustic mirror including at least one higher impedance layer having a thickness co-optimized to reflect both longitudinal and shear waves generated in a piezoelectric layer, including but not limited to the acoustic device 100 in FIG. 1. In this regard, FIG. 3 is a flowchart illustrating an exemplary fabrication process 300 of fabricating the acoustic device 100 including at least one higher impedance layer having a thickness co-optimized to reflect both longitudinal and shear waves generated in a piezoelectric layer, including but not limited to the acoustic device 100 in FIG. 1. The fabrication process 300 is discussed with reference to the acoustic device 100 in FIG. 1, but note that the fabrication process 300 is not limited to fabricating the acoustic device in FIG. 1.

In this regard, an exemplary step in fabricating the acoustic device 100 includes forming an acoustic mirror 102 (block 302), which includes forming a first higher impedance layer 106A having a first thickness T106 (block 304) and forming a first lower impedance layer 124 on the first higher impedance layer 106A (block 306). Forming the acoustic mirror 102 further includes forming a second high-impedance layer 104A having a second thickness T104 on the first low-impedance layer 124 wherein the second thickness T104 is greater than the first thickness T106 (block 308). Forming the acoustic mirror 102 also includes forming a second low-impedance layer 126 on the second high-impedance layer 104A (block 310. Forming the acoustic device 100 further includes forming a bottom electrode 118 on the acoustic mirror 102 (block 312) and forming a piezoelectric layer 114 on the bottom electrode 118 (block 314). Forming the acoustic device 100 further includes forming a first top electrode 110A on the piezoelectric layer 114 (block 316). Other fabrication processes can also be employed to fabricate the acoustic device 100 including an acoustic mirror including at least one higher impedance layer having a thickness co-optimized to reflect both longitudinal and shear waves generated in a piezoelectric layer.

Figure 4:
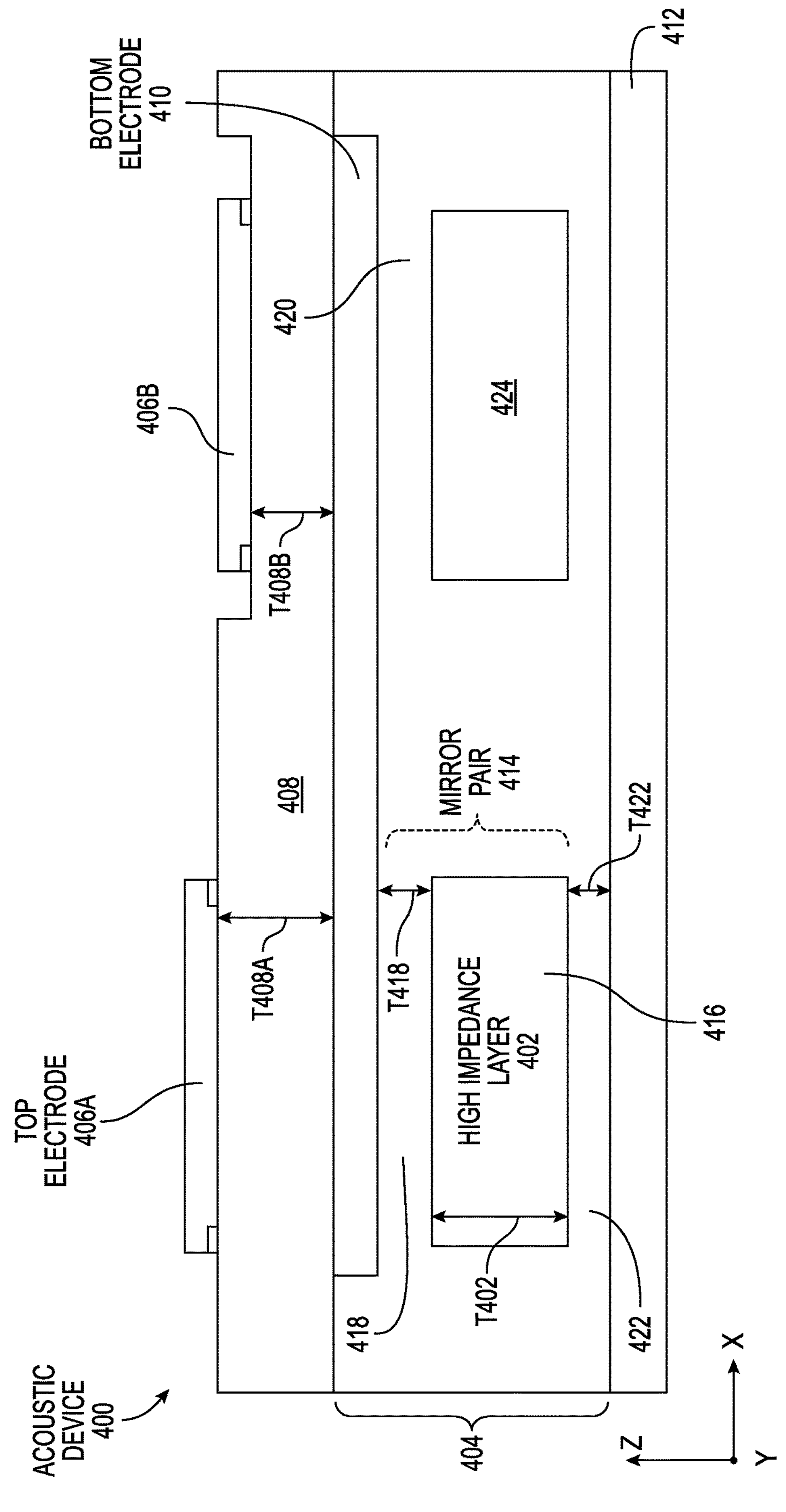
FIG. 4 is another example of an acoustic device in which a thickness of a higher impedance layer in an acoustic mirror is co-optimized for reflecting both longitudinal waves and shear waves at a target frequency.

The acoustic device 100 in FIG. 1 is a first example of an acoustic device including at least one higher impedance layer having a thickness co-optimized to reflect both longitudinal and shear waves generated in a piezoelectric layer. FIG. 4 is a cross-sectional side view of an acoustic device 400 in which a thickness T402 of a higher impedance layer 402 in an acoustic mirror 404 is optimized for reflecting both longitudinal waves and shear waves at a target frequency $F_{400}$. The acoustic device 400 operates in a manner similar to the acoustic device 100 in FIG. 1 in response to receiving signals IN1 and IN2 at second, top electrode 406A and third, top electrode 406B. The signals IN1 and IN2 have varying voltages that cause expansion and contraction of a piezoelectric layer 408 between the top electrodes 406A, 406B, and a first, bottom electrode 410. A thickness T408A of the piezoelectric layer 408 between the second, top electrode 406A and the first, bottom electrode 410 may be the same or greater than a thickness T408B of the piezoelectric layer 408 between the top electrode 406B and the bottom electrode 410. The acoustic mirror 404 in this example may include only one mirror pair 414 for reasons including a reduction of process steps, which reduces manufacturing cost, and/or to improve heat dissipation by conduction to the substrate 412 because the lower impedance acoustic impedance material 420 (e.g., $SiO_2$) is a poor thermal conductor.

The higher impedance layer 402 in the mirror pair 414 includes a fifth thickness T402 that corresponds to the second thickness T104A of the second higher impedance layer 104A in FIG. 1. In particular, the thickness T402 of the higher impedance layer 402 is greater than half the wavelength $\lambda_H(>\lambda_H/2)$ of an acoustic wave in the higher impedance layer 402 at a target operating frequency of the acoustic device 400. The wavelength $\lambda_H$ in the high-impedance layer 402 at a particular frequency depends on an acoustic impedance of a higher acoustic impedance material 416 (e.g., W) from which the high-impedance layer 402 is formed. In some examples, the thickness T402 is within twenty percent (i.e., +/−20%) of three-quarters of the wavelength $\lambda_H(3/4\times\lambda_H)$. In some examples, the thickness T402 is three-quarters of the wavelength $\lambda_H$.

The mirror pair 414 also includes a lower impedance layer 418 of the lower acoustic impedance material 420 (e.g., $SiO_2$) and having a thickness T418 that is less than half of a wavelength $\lambda_L$ of an acoustic wave in the lower acoustic impedance material 420 at the target operating frequency $F_{400}$. The lower impedance layer 418 is disposed between the higher impedance layer 402 and the bottom electrode 410. In some examples, the thickness T418 of the lower impedance layer 418 is equal to or within 20% of one-quarter of the wavelength $\lambda_L$. In other words, the lower impedance layer 418 may have a thickness of $\lambda_L/4$ or between (80% and 120%) of $\lambda_L/4$.

The combination of thicknesses T418 and T402 are co-optimized to reflect both longitudinal and shear waves generated in the piezoelectric layer 408.

The acoustic device 400 also includes a bottom lower impedance layer 422 having a thickness T422, which may be greater than the ranges of the thickness T418 described above because there is significantly less energy remaining in acoustic waves in the bottom low impedance layer 422 than in the lower impedance layer 418.

The acoustic devices 100 and 400 according to aspects disclosed herein, may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 5:
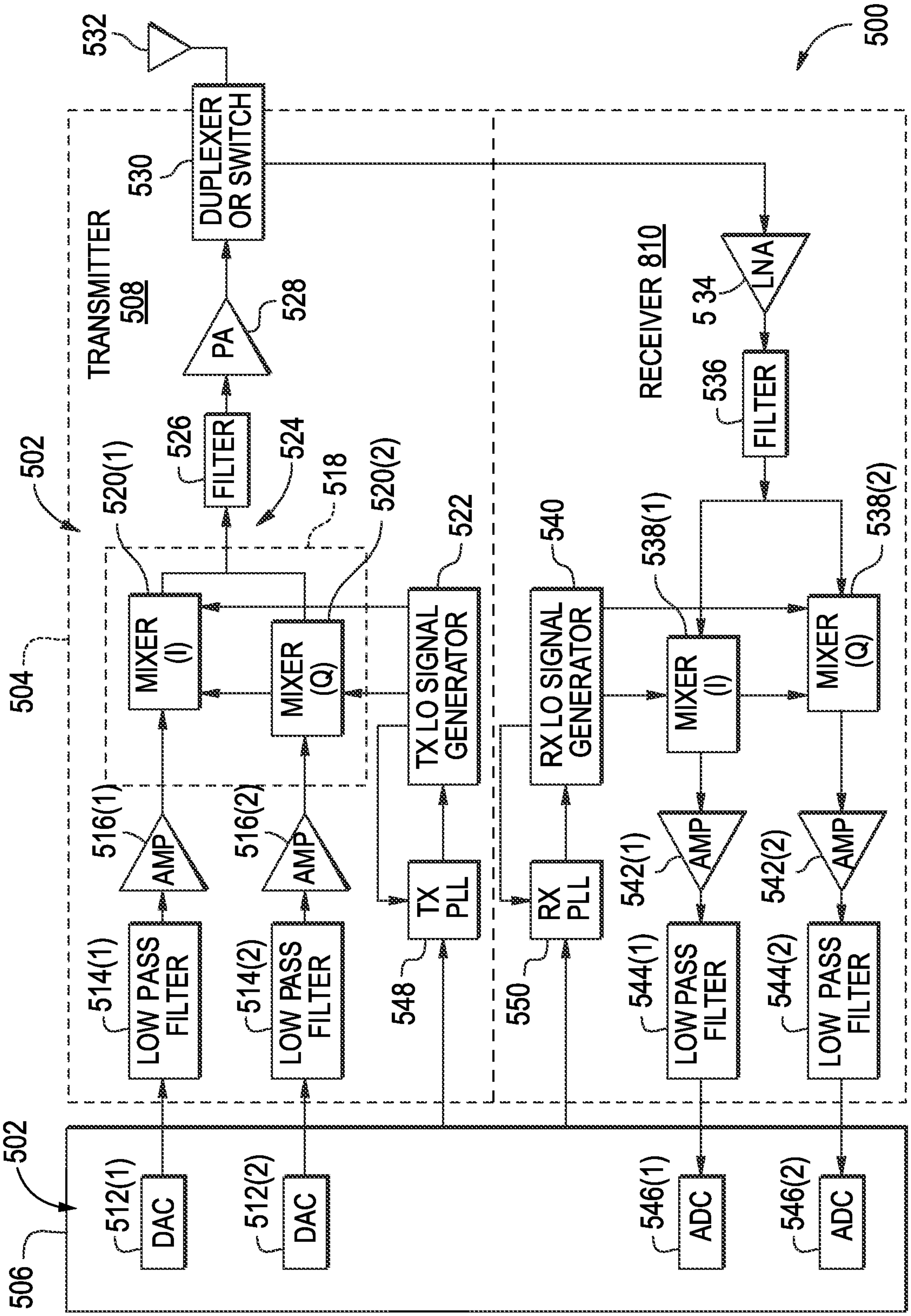
FIG. 5 is a block diagram of an exemplary wireless communications device, including integrated circuits (ICs) that can include acoustic devices including at least one higher impedance layers having a thickness co-optimized for reflecting longitudinal and shear waves, including but not limited to the acoustic device in FIGS. 1, 2, and 4, and can be fabricated according to the exemplary fabrication process in FIG. 3.

In this regard, FIG. 5 illustrates an exemplary wireless communications device 500 that includes radio frequency (RF) components formed from one or more ICs 502, wherein any of the ICs 502 can include acoustic devices including at least one higher impedance layers having a thickness co-optimized for reflecting longitudinal and shear waves, including but not limited to the acoustic device in FIGS. 1, 2, and 4, and according to any aspects disclosed herein. The wireless communications device 500 may include or be provided in any of the above-referenced devices as examples. As shown in FIG. 5, the wireless communications device 500 includes a transceiver 504 and a data processor 506. The data processor 506 may include a memory to store data and program codes. The transceiver 504 includes a transmitter 508 and a receiver 510, which support bi-directional communications. In general, the wireless communications device 500 may include any number of transmitters 508 and/or receivers 510 for any number of communication systems and frequency bands. All or a portion of the transceiver 504 may be implemented on one or more analog ICs, RF ICs (RFICs), mixed-signal ICs, etc.

The transmitter 508 or the receiver 510 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 500 in FIG. 5, the transmitter 508 and the receiver 510 are implemented with the direct-conversion architecture.

In the transmit path, the data processor 506 processes data to be transmitted and provides I and Q analog output signals to the transmitter 508. In the exemplary wireless communications device 500, the data processor 506 includes digital-to-analog converters (DACs) 512(1), 512(2) for converting digital signals generated by the data processor 506 into I and Q analog output signals, e.g., I and Q output currents, for further processing.

Within the transmitter 508, lowpass filters 514(1), 514(2) filter the I and Q analog output signals, respectively, to remove undesired signals caused by the prior digital-to-analog conversion. Amplifiers (AMPs) 516(1), 516(2) amplify the signals from the lowpass filters 514(1), 514(2), respectively, and provide I and Q baseband signals. An upconverter 518 upconverts the I and Q baseband signals with I and Q transmit (TX) local oscillator (LO) signals from a TX LO signal generator 522 through mixers 520(1), 520(2) to provide an upconverted signal 524. A filter 526 filters the upconverted signal 524 to remove undesired signals caused by the frequency upconversion as well as noise in a receive frequency band. A power amplifier (PA) 528 amplifies the upconverted signal 524 from the filter 526 to obtain the desired output power level and provides a transmit RF signal. The transmit RF signal is routed through a duplexer or switch 530 and transmitted via an antenna 532.

In the receive path, the antenna 532 receives signals transmitted by base stations and provides a received RF signal, which is routed through the duplexer or switch 530 and provided to a low noise amplifier (LNA) 534. The duplexer or switch 530 is designed to operate with a specific receive (RX)-to-TX duplexer frequency separation, such that RX signals are isolated from TX signals. The received RF signal is amplified by the LNA 534 and filtered by a filter 536 to obtain a desired RF input signal. Downconversion mixers 538(1), 538(2) mix the output of the filter 536 with I and Q RX LO signals (i.e., LO_I and LO_Q) from an RX LO signal generator 540 to generate I and Q baseband signals. The I and Q baseband signals are amplified by AMPs 542(1), 542(2) and further filtered by lowpass filters 544(1), 544(2) to obtain I and Q analog input signals, which are provided to the data processor 506. In this example, the data processor 506 includes analog-to-digital converters (ADCs) 546(1), 546(2) for converting the analog input signals into digital signals to be further processed by the data processor 506.

In the wireless communications device 500 of FIG. 5, the TX LO signal generator 522 generates the I and Q TX LO signals used for frequency upconversion, while the RX LO signal generator 540 generates the I and Q RX LO signals used for frequency downconversion. Each LO signal is a periodic signal with a particular fundamental frequency. A TX phase-locked loop (PLL) circuit 548 receives timing information from the data processor 506 and generates a control signal used to adjust the frequency and/or phase of the TX LO signals from the TX LO signal generator 522. Similarly, an RX PLL circuit 550 receives timing information from the data processor 506 and generates a control signal used to adjust the frequency and/or phase of the RX LO signals from the RX LO signal generator 540.

Figure 6:
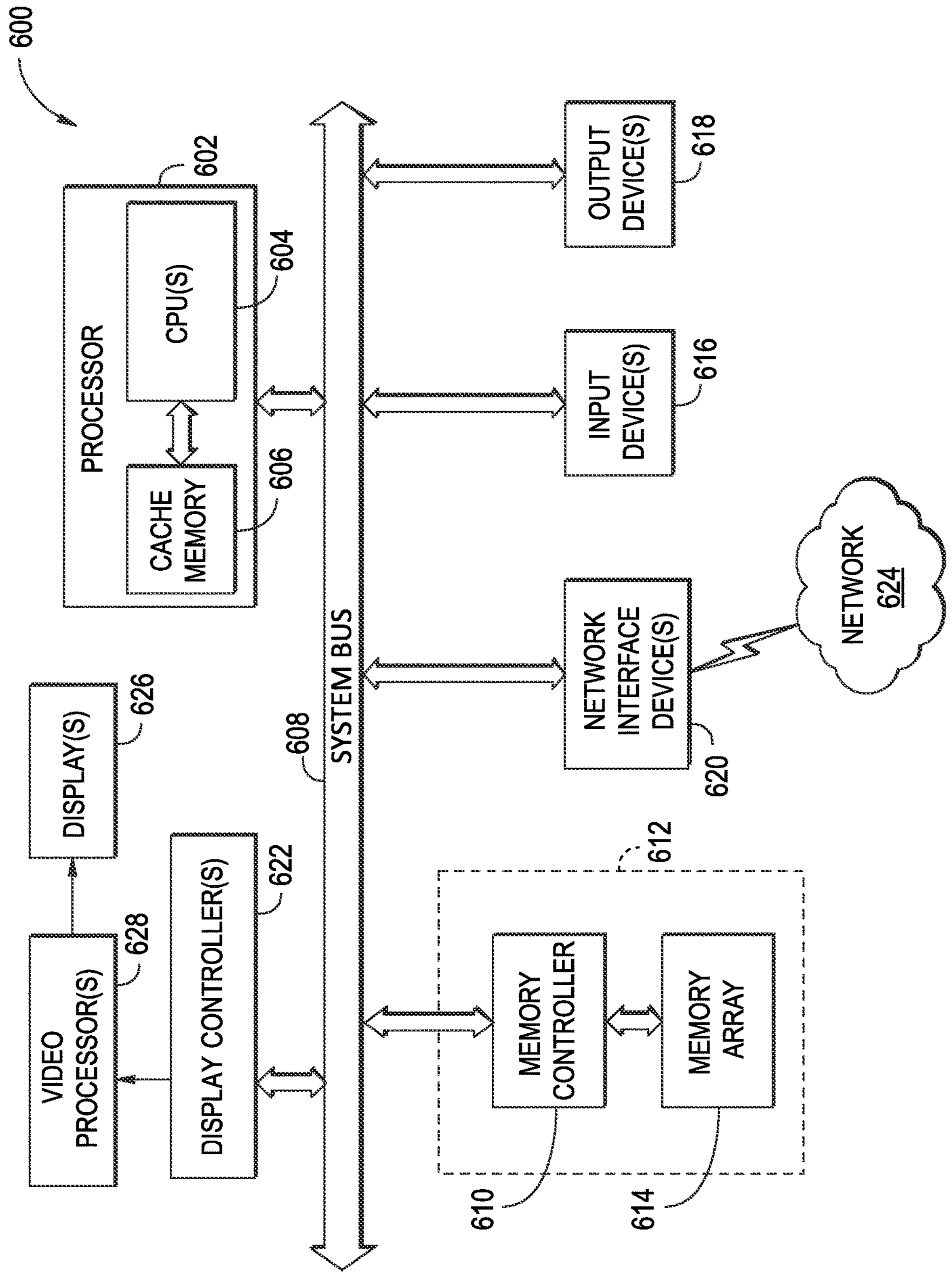
FIG. 6 is a block diagram of an exemplary processor-based system that can include acoustic devices including at least one higher impedance layer having a thickness co-optimized for reflecting longitudinal and shear waves, including but not limited to the acoustic device in FIGS. 1, 2, and 4, and can be fabricated according to the exemplary fabrication process in FIG. 3.

FIG. 6 illustrates an example of a processor-based system 600 that can employ include acoustic devices including at least one higher impedance layer having a thickness co-optimized for reflecting longitudinal and shear waves, including but not limited to the acoustic device in FIGS. 1, 2, and 4, and according to aspects disclosed herein. In this example, the processor-based system 600 includes one or more central processor units (CPUs) 602, which may also be referred to as CPU or processor cores, each including one or more processors 604. The CPU(s) 602 may have cache memory 606 coupled to the processor(s) 604 for rapid access to temporarily stored data. The CPU(s) 602 is coupled to a system bus 608 and can intercouple master and slave devices included in the processor-based system 600. As is well known, the CPU(s) 602 communicates with these other devices by exchanging address, control, and data information over the system bus 608. For example, the CPU(s) 602 can communicate bus transaction requests to a memory controller 610 as an example of a slave device. Although not illustrated in FIG. 6, multiple system buses 608 could be provided; wherein each system bus 608 constitutes a different fabric.

Other master and slave devices can be connected to the system bus 608. As illustrated in FIG. 6, these devices can include a memory system 612 that includes the memory controller 610 and one or more memory arrays 614, one or more input devices 616, one or more output devices 618, one or more network interface devices 620, and one or more display controllers 622, as examples. The input device(s) 616 can include any type of input device, including, but not limited to, input keys, switches, voice processors, etc. The output device(s) 618 can include any type of output device, including, but not limited to, audio, video, other visual indicators, etc. The network interface device(s) 620 can be any device configured to allow an exchange of data to and from a network 624. The network 624 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 620 can be configured to support any type of communications protocol desired.

The CPU(s) 602 may also be configured to access the display controller(s) 622 over the system bus 608 to control information sent to one or more displays 626. The display controller(s) 622 sends information to the display(s) 626 to be displayed via one or more video processors 628, which process the information to be displayed into a format suitable for the display(s) 626. The display(s) 626 can include any type of display, including, but not limited to, a cathode ray tube (CRT), a liquid crystal display (LCD), a plasma display, or a light-emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium wherein any such instructions are executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. An acoustic device comprising:
   - a first electrode;
   - a piezoelectric layer disposed on a first side of the first electrode;
   - a second electrode disposed on the piezoelectric layer; and
   - an acoustic mirror disposed on a second side of the first electrode opposite to the piezoelectric layer, the acoustic mirror comprising:
     - a first higher impedance layer having a first thickness;
     - a second higher impedance layer having a second thickness, wherein the second thickness is greater than the first thickness;
     - a first lower impedance layer between the first higher impedance layer and the second higher impedance layer; and
     - a second lower impedance layer between the second higher impedance layer and the first electrode.
2. The acoustic device of clause 1, wherein the second thickness of the second higher impedance layer is at least two times the first thickness of the first higher impedance layer.
3. The acoustic device of clause 1, wherein the second thickness of the second higher impedance layer is at least three times the first thickness of the first higher impedance layer.
4. The acoustic device of any of clause 1 to clause 3, wherein:
   - the first lower impedance layer and the second lower impedance layer each comprises a lower impedance material; and
   - the first higher impedance layer and the second higher impedance layer each comprises a higher impedance material having a greater acoustic impedance than the lower impedance material.
5. The acoustic device of clause 4, wherein:
   - the first lower impedance layer has a third thickness corresponding to less than half of a wavelength of a target frequency in the lower impedance material;
   - the second lower impedance layer has a fourth thickness corresponding to less than half of the wavelength of the target frequency in the lower impedance material;
   - the first thickness corresponds to less than half of a wavelength of the target frequency in the higher impedance material; and
   - the second thickness corresponds to greater than one half of the wavelength of the target frequency in the higher impedance material.
6. The acoustic device of clause 4, wherein:
   - the first lower impedance layer has a third thickness corresponding to one quarter of a wavelength of a target frequency in the lower impedance material;
   - the second lower impedance layer has a fourth thickness corresponding to one quarter of the wavelength of the target frequency in the lower impedance material;
   - the first thickness corresponds to one quarter of a wavelength of the target frequency in the higher impedance material; and
   - the second thickness corresponds to three quarters of the wavelength of the target frequency in the higher impedance material.
7. The acoustic device of any of clause 1 to clause 6, further comprising:
   - the second electrode disposed on the piezoelectric layer over a first region of the first electrode;
   - a third electrode disposed on the piezoelectric layer over a second region of the first electrode; and
   - in the acoustic mirror adjacent to the second region of the first electrode:
     - a third higher impedance layer having a fifth thickness; and
     - a fourth higher impedance layer having a sixth thickness between the first lower impedance layer and the second lower impedance layer,
   - wherein the sixth thickness is greater than the fifth thickness.
8. The acoustic device of clause 7, further comprising:
   - a substrate; and
   - a bottom lower impedance layer between the substrate and the first higher impedance layer, and between the substrate and the third higher impedance layer.
9. The acoustic device of any of clause 1 to clause 8, further comprising:
   - a first adhesion layer between the first lower impedance layer and the first higher impedance layer; and
   - a buffer layer between the first electrode and the piezoelectric layer.
10. The acoustic device of clause 8, wherein:
    - the first lower impedance layer, the second lower impedance layer, and the bottom lower impedance layer each comprise silicon dioxide ($SiO_2$);
    - the first higher impedance layer and the second higher impedance layer each comprise tungsten (W);
    - the second electrode and the first electrode comprise molybdenum (Mo); and
    - the piezoelectric layer comprises aluminum nitride (AlN).
11. The acoustic device of any of clause 1 to clause 10 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.
12. A method of fabricating an acoustic device comprising:
    - forming an acoustic mirror, comprising:
      - forming a first higher impedance layer comprising a first thickness;

forming a first lower impedance layer on the first higher impedance layer;

forming a second higher impedance layer comprising a second thickness on the first lower impedance layer; and forming a second lower impedance layer on the second higher impedance layer;

forming a first electrode on the acoustic mirror;

forming a piezoelectric layer on the first electrode; and forming a second electrode on the piezoelectric layer, wherein the second thickness is greater than the first thickness.

13. The method of clause 12, wherein:

forming the first lower impedance layer comprises forming the first lower impedance layer of a lower impedance material; and forming the second lower impedance layer comprises forming the second lower impedance layer of the lower impedance material, wherein the first higher impedance layer and the second higher impedance layer each comprises a higher impedance material having a greater acoustic impedance than the lower impedance material.

14. The method of clause 13, wherein:

the first thickness corresponds to less than half of a wavelength of a target frequency in the higher impedance material; and the second thickness corresponds to greater than half of the wavelength of the target frequency in the higher impedance material.

15. The method of clause 13, wherein:

the first thickness corresponds to one quarter of a wavelength of a target frequency in the higher impedance material; and the second thickness corresponds to three quarters of the wavelength of the target frequency in the higher impedance material.

16. An acoustic device comprising:

a first electrode;

a piezoelectric layer disposed on a first side of the first electrode;

a second electrode disposed on the piezoelectric layer; and an acoustic mirror disposed on a second side of the first electrode opposite to the piezoelectric layer, the acoustic mirror comprising:

a first higher impedance layer comprising a higher impedance material having a first thickness corresponding to greater than half of a wavelength at a target frequency in the higher impedance material; and a first lower impedance layer comprising a lower impedance material having a second thickness corresponding to less than half of a wavelength of the target frequency in the lower impedance material, the first lower impedance layer disposed between the first higher impedance layer and the first electrode.

17. The acoustic device of clause 16, further comprising:

a substrate; and a second lower impedance layer comprising the lower impedance material having a third thickness located between the first higher impedance layer and the substrate.

18. The acoustic device of clause 17, further comprising:

a second higher impedance layer between the second lower impedance layer and the substrate and comprising the higher impedance material having a fourth thickness of less than half of the wavelength of the target frequency in the higher impedance material; and a third lower impedance layer comprising the lower impedance material having a fifth thickness, the third lower impedance layer between the second higher impedance layer and the substrate.

19. The acoustic device of any of clause 16 to clause 18, wherein:

the first thickness corresponds to three quarters of the wavelength of the target frequency in the higher impedance material;

the second thickness corresponds to one quarter of the wavelength of the target frequency in the lower impedance material.

20. The acoustic device of clause 17 or clause 18, wherein:

the first lower impedance layer and the second lower impedance layer comprise silicon dioxide ($SiO_2$);

the first higher impedance layer comprises tungsten (W);

the second electrode and the first electrode comprise molybdenum (Mo); and the piezoelectric layer comprises aluminum nitride (AlN).

21. The acoustic device of clause 18, wherein the first thickness of the first higher impedance layer is at least two times the fourth thickness of the second higher impedance layer.

22. The acoustic device of clause 18, wherein the first thickness of the first higher impedance layer is at least three times the fourth thickness of the second higher impedance layer.

What is claimed is:

1. An acoustic device comprising:

a first electrode;

a piezoelectric layer disposed on a first side of the first electrode;

a second electrode disposed on the piezoelectric layer; and an acoustic mirror disposed on a second side of the first electrode opposite to the piezoelectric layer, the acoustic mirror comprising:

a first higher impedance layer having a first thickness;

a second higher impedance layer having a second thickness, wherein the second thickness is greater than the first thickness;

a first lower impedance layer between the first higher impedance layer and the second higher impedance layer; and a second lower impedance layer between the second higher impedance layer and the first electrode.

2. The acoustic device of claim 1, wherein the second thickness of the second higher impedance layer is at least two times the first thickness of the first higher impedance layer.

3. The acoustic device of claim 1, wherein the second thickness of the second higher impedance layer is at least three times the first thickness of the first higher impedance layer.

4. The acoustic device of claim 1, wherein:

the first lower impedance layer and the second lower impedance layer each comprises a lower impedance material; and the first higher impedance layer and the second higher impedance layer each comprises a higher impedance material having a greater acoustic impedance than the lower impedance material.

5. The acoustic device of claim 4, wherein:

the first lower impedance layer has a third thickness corresponding to less than half of a wavelength of a target frequency in the lower impedance material;

the second lower impedance layer has a fourth thickness corresponding to less than half of the wavelength of the target frequency in the lower impedance material;

the first thickness corresponds to less than half of a wavelength of the target frequency in the higher impedance material; and the second thickness corresponds to greater than one half of the wavelength of the target frequency in the higher impedance material.

6. The acoustic device of claim 4, wherein:

the first lower impedance layer has a third thickness corresponding to one quarter of a wavelength of a target frequency in the lower impedance material;

the second lower impedance layer has a fourth thickness corresponding to one quarter of the wavelength of the target frequency in the lower impedance material;

the first thickness corresponds to one quarter of a wavelength of the target frequency in the higher impedance material; and the second thickness corresponds to three quarters of the wavelength of the target frequency in the higher impedance material.

7. The acoustic device of claim 1, further comprising:

the second electrode disposed on the piezoelectric layer over a first region of the first electrode;

a third electrode disposed on the piezoelectric layer over a second region of the first electrode; and in the acoustic mirror adjacent to the second region of the first electrode:

a third higher impedance layer having a fifth thickness; and a fourth higher impedance layer having a sixth thickness between the first lower impedance layer and the second lower impedance layer, wherein the sixth thickness is greater than the fifth thickness.

8. The acoustic device of claim 7, further comprising:

a substrate; and a bottom lower impedance layer between the substrate and the first higher impedance layer, and between the substrate and the third higher impedance layer.

9. The acoustic device of claim 8, wherein:

the first lower impedance layer, the second lower impedance layer, and the bottom lower impedance layer each comprise silicon dioxide ($SiO_2$);

the first higher impedance layer and the second higher impedance layer each comprise tungsten (W);

the second electrode and the first electrode comprise molybdenum (Mo); and the piezoelectric layer comprises aluminum nitride (AlN).

10. The acoustic device of claim 1, further comprising:

a first adhesion layer between the first lower impedance layer and the first higher impedance layer; and a buffer layer between the first electrode and the piezoelectric layer.

11. The acoustic device of claim 1 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

12. A method of fabricating an acoustic device comprising:

forming an acoustic mirror, comprising:

forming a first higher impedance layer comprising a first thickness;

forming a first lower impedance layer on the first higher impedance layer;

forming a second higher impedance layer comprising a second thickness on the first lower impedance layer; and forming a second lower impedance layer on the second higher impedance layer;

forming a first electrode on the acoustic mirror;

forming a piezoelectric layer on the first electrode; and forming a second electrode on the piezoelectric layer, wherein the second thickness is greater than the first thickness.

13. The method of claim 12, wherein:

forming the first lower impedance layer comprises forming the first lower impedance layer of a lower impedance material; and forming the second lower impedance layer comprises forming the second lower impedance layer of the lower impedance material, wherein the first higher impedance layer and the second higher impedance layer each comprises a higher impedance material having a greater acoustic impedance than the lower impedance material.

14. The method of claim 13, wherein:

the first thickness corresponds to less than half of a wavelength of a target frequency in the higher impedance material; and the second thickness corresponds to greater than half of the wavelength of the target frequency in the higher impedance material.

15. The method of claim 13, wherein:

the first thickness corresponds to one quarter of a wavelength of a target frequency in the higher impedance material; and the second thickness corresponds to three quarters of the wavelength of the target frequency in the higher impedance material.

16. An acoustic device comprising:

a first electrode;

a piezoelectric layer disposed on a first side of the first electrode;

a second electrode disposed on the piezoelectric layer; and an acoustic mirror disposed on a second side of the first electrode opposite to the piezoelectric layer, the acoustic mirror comprising:

a first higher impedance layer comprising a higher impedance material having a first thickness corresponding to greater than half of a wavelength at a target frequency in the higher impedance material; and a first lower impedance layer comprising a lower impedance material having a second thickness corresponding to less than half of a wavelength of the target frequency in the lower impedance material, the first lower impedance layer disposed between the first higher impedance layer and the first electrode.

17. The acoustic device of claim 16, further comprising:

a substrate; and a second lower impedance layer comprising the lower impedance material having a third thickness located between the first higher impedance layer and the substrate.

18. The acoustic device of claim 17, further comprising:

a second higher impedance layer between the second lower impedance layer and the substrate and comprising the higher impedance material having a fourth thickness of less than half of the wavelength of the target frequency in the higher impedance material; and a third lower impedance layer comprising the lower impedance material having a fifth thickness, the third lower impedance layer between the second higher impedance layer and the substrate.

19. The acoustic device of claim 18, wherein the first thickness of the first higher impedance layer is at least two times the fourth thickness of the second higher impedance layer.

20. The acoustic device of claim 18, wherein the first thickness of the first higher impedance layer is at least three times the fourth thickness of the second higher impedance layer.

21. The acoustic device of claim 17, wherein:

the first lower impedance layer and the second lower impedance layer comprise silicon dioxide ($SiO_2$);

the first higher impedance layer comprises tungsten (W);

the second electrode and the first electrode comprise molybdenum (Mo); and the piezoelectric layer comprises aluminum nitride (AlN).

22. The acoustic device of claim 16, wherein:

the first thickness corresponds to three quarters of the wavelength of the target frequency in the higher acoustic impedance material;

the second thickness corresponds to one quarter of the wavelength of the target frequency in the lower impedance material.

* * * * *